(12) United States Patent
Zhang

(10) Patent No.: US 11,522,554 B2
(45) Date of Patent: *Dec. 6, 2022

(54) PROGRAMMABLE GAIN AMPLIFIER AND A DELTA SIGMA ANALOG-TO-DIGITAL CONVERTER CONTAINING THE PGA

(71) Applicant: Texas Instruments Incorporated, Dallas, TX (US)

(72) Inventor: Jun Zhang, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 125 days.

This patent is subject to a terminal disclaimer.

(21) Appl. No.: 16/933,599

(22) Filed: Jul. 20, 2020

(65) Prior Publication Data

US 2020/0389178 A1    Dec. 10, 2020

Related U.S. Application Data

(63) Continuation of application No. 16/427,468, filed on May 31, 2019, now Pat. No. 10,720,937, which is a
(Continued)

(51) Int. Cl.
*H03G 3/20* (2006.01)
*H03M 1/18* (2006.01)
(Continued)

(52) U.S. Cl.
CPC .............. *H03M 1/185* (2013.01); *H03F 1/38* (2013.01); *H03F 3/45475* (2013.01);
(Continued)

(58) Field of Classification Search
CPC .... H03F 1/56; H03F 3/45; H03G 3/20; H03G 3/30
(Continued)

(56) References Cited

U.S. PATENT DOCUMENTS 4,467,286 A    8/1984   Stitt
7,375,587 B2   5/2008   Chiricosta et al.
(Continued)

FOREIGN PATENT DOCUMENTS

EP            2498400 A1   9/2012
WO PCT/CN2017/102780     9/2017

*Primary Examiner* — Samuel S Outten
*Assistant Examiner* — Khiem D Nguyen
(74) *Attorney, Agent, or Firm* — Krista Y. Chan; Charles A. Brill; Frank D. Cimino

(57) ABSTRACT

A circuit includes an operational amplifier and a resistor network coupled to an output of the operational amplifier. The resistor network includes a first set of resistors coupled between the output of the operational amplifier and a first node of the resistor network, wherein the resistors of the first set are electrically connected in series with each other, a second set of resistors coupled between the first node and a second node of the resistor network, wherein the resistors of the second set are electrically connected in series with each other and include a first number of resistors, a third set of resistors coupled between the second node and a third node of the resistor network, wherein the third node is coupled to a first voltage, and wherein the resistors of the third set are electrically connected in parallel with each other and include a second number of resistors, and a resistor coupled between the first node and the second node and arranged in parallel with the second set of resistors.

19 Claims, 9 Drawing Sheets

Related U.S. Application Data continuation of application No. 15/877,098, filed on Jan. 22, 2018, now Pat. No. 10,312,931, which is a continuation of application No. PCT/CN2017/102780, filed on Sep. 21, 2017.

(51) Int. Cl.
*H03G 1/00* (2006.01)
*H03F 1/38* (2006.01)
*H03M 3/00* (2006.01)
*H03F 3/45* (2006.01)
*H03G 3/00* (2006.01)

(52) U.S. Cl.
CPC .......... *H03G 1/0088* (2013.01); *H03G 3/001* (2013.01); *H03G 3/20* (2013.01); *H03M 1/187* (2013.01); *H03M 3/356* (2013.01); *H03M 3/464* (2013.01); *H03F 2203/45522* (2013.01); *H03M 3/494* (2013.01)

(58) Field of Classification Search
USPC .............................. 330/69, 86, 144, 282, 284
See application file for complete search history.

(56) References Cited

U.S. PATENT DOCUMENTS

| | | |
|---|---|---|
| 7,843,261 B2 | 11/2010 | Schaffer |
| 9,112,465 B2 | 8/2015 | Dey et al. |
| 10,312,931 B2 | 6/2019 | Zhang |
| 10,720,937 B2 * | 7/2020 | Zhang ..................... H03G 3/20 |
| 2010/0001792 A1 | 1/2010 | Lo et al. |
| 2015/0084693 A1 | 3/2015 | Larson |

\* cited by examiner

PROGRAMMABLE GAIN AMPLIFIER AND A DELTA SIGMA ANALOG-TO-DIGITAL CONVERTER CONTAINING THE PGA

CROSS-REFERENCE TO RELATED APPLICATION(S)

This application is a continuation of U.S. patent application Ser. No. 15/877,098 filed on Jan. 22, 2018, which is a continuation of PCT International Application No. PCT/CN2017/102780 filed on Sep. 21, 2017, all of which are incorporated by reference in their entirety.

FIELD OF THE DISCLOSURE

Disclosed embodiments relate generally to the field of programmable gain amplifiers (PGAs). More particularly, and not by way of any limitation, the present disclosure is directed to a programmable gain amplifier and a delta sigma analog-to-digital converter (ADC) containing a PGA.

BACKGROUND

The Common Mode Rejection Ratio (CMRR) for a PGA is determined by the matching between the resistors around the output amplifier. Existing designs can require large areas and/or offer poor performance to achieve a wide range of selectable gain. Improvements are needed in the PGA design to improve performance and required area.

SUMMARY

Disclosed embodiments provide a resistor network that can be utilized in a feedback loop. When incorporated into a feedback loop, the resistor network uses less equivalent resistance than many previous resistor networks to achieve the same gain. The solution can reduce the number of the critical matching devices so that the CMRR and PGA gain error performance are improved. Compared to some existing designs utilizing the same unit resistor, the disclosed resistor network can achieve lower power consumption and compared to some existing designs utilizing the same drive current, the disclosed resistor network can be provided on a smaller die area and improve matching. Thermal noise produced by the resistor network can be reduced due to the lower equivalent resistance of the resistor network.

In one aspect, an embodiment of a programmable gain amplifier is disclosed. The PGA includes a first operational amplifier comprising a first non-inverting input node, a first inverting input node and a first output node; and first resistor network coupled to the first output node, the first resistor network comprising: a first plurality of resistors coupled in series between the first output node and a first resistor network node; a second plurality of resistors coupled in series between the first resistor network node and a second resistor network node; a first unit resistor coupled in parallel with the second plurality of resistors between the first resistor network node and the second resistor network node; and a third plurality of resistors coupled in parallel between the second resistor network node and a reference voltage, wherein each resistor of the second plurality of resistors and of the third plurality of resistors comprises a unit resistor and further wherein the third plurality of resistors contains a number N of resistors and the second plurality of resistors contains (N−1) resistors.

In another aspect, an embodiment of an electronic device is disclosed. The electronic device includes a first operational amplifier having a first inverting input node and a first non-inverting input node and being further coupled to provide a first output signal on a first output node; a second operational amplifier having a second inverting input node and a second non-inverting input node and being further coupled to provide a second output signal on a second output node, each of the first and second operational amplifiers being coupled to receive a respective one of a pair of differential signals on a respective non-inverting input; and a resistor network having a first terminal coupled to the first inverting input node and a second terminal coupled to the second inverting input node, the resistor network comprising a first plurality of resistors coupled in series between the first output node and a first resistor network node; a second plurality of resistors coupled in series between the first resistor network node and a second resistor network node; a first unit resistor coupled in parallel with the second plurality of resistors between the first resistor network node and the second resistor network node; and a third plurality of resistors coupled in parallel between the second resistor network node and a reference voltage, wherein each resistor of the second plurality of resistors and of the third plurality of resistors comprises a unit resistor and further wherein the third plurality of resistors contains a number N of resistors and the second plurality of resistors contains (N−1) resistors.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 7:
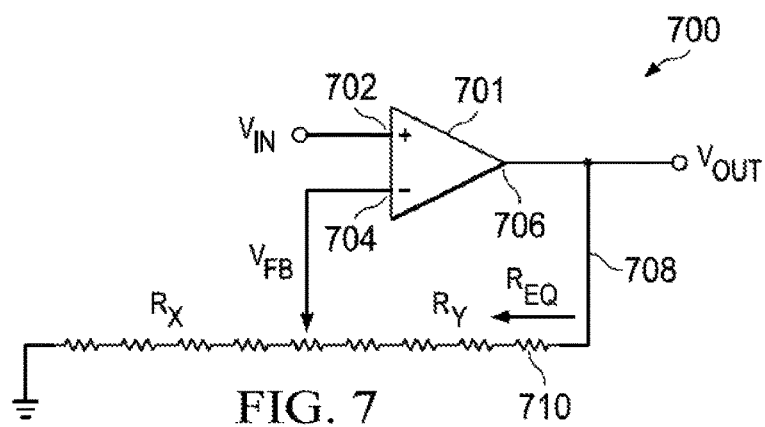
FIG. 7 depicts generalized schematic of a PGA.

FIG. 7 depicts a generalized version of a PGA 700. As shown, PGA 700 includes an operational amplifier 701, which has a non-inverting input node 702, an inverting input node 704 and an output node 706. PGA 700 receives an input signal $V_{IN}$ on non-inverting input 702 and provides an output signal $V_{OUT}$ on output node 706. A feedback loop 708 feeds the output voltage $V_{OUT}$ to a variable resistor 710 and provides at least a portion of $V_{OUT}$ to inverting input node 704 as feedback voltage $V_{FB}$. The equivalent voltage of variable resistor 710 is given by $R_{EQ}$ and the point from which the feedback voltage $V_{FB}$ is taken divides the resistance $R_{EQ}$ into $R_X$ and $R_Y$ as shown. As is known, the gain, G, of PGA 700 is given by the equation:

$$G = \left(1 + \frac{R_Y}{R_X}\right) \quad \text{Equation 1}$$

The drive current $I_{DRIVE}$ is given by the equation:

$$I_{DRIVE} = \frac{V_{OUT}}{R_X + R_Y} \quad \text{Equation 2}$$

Figure 1A:
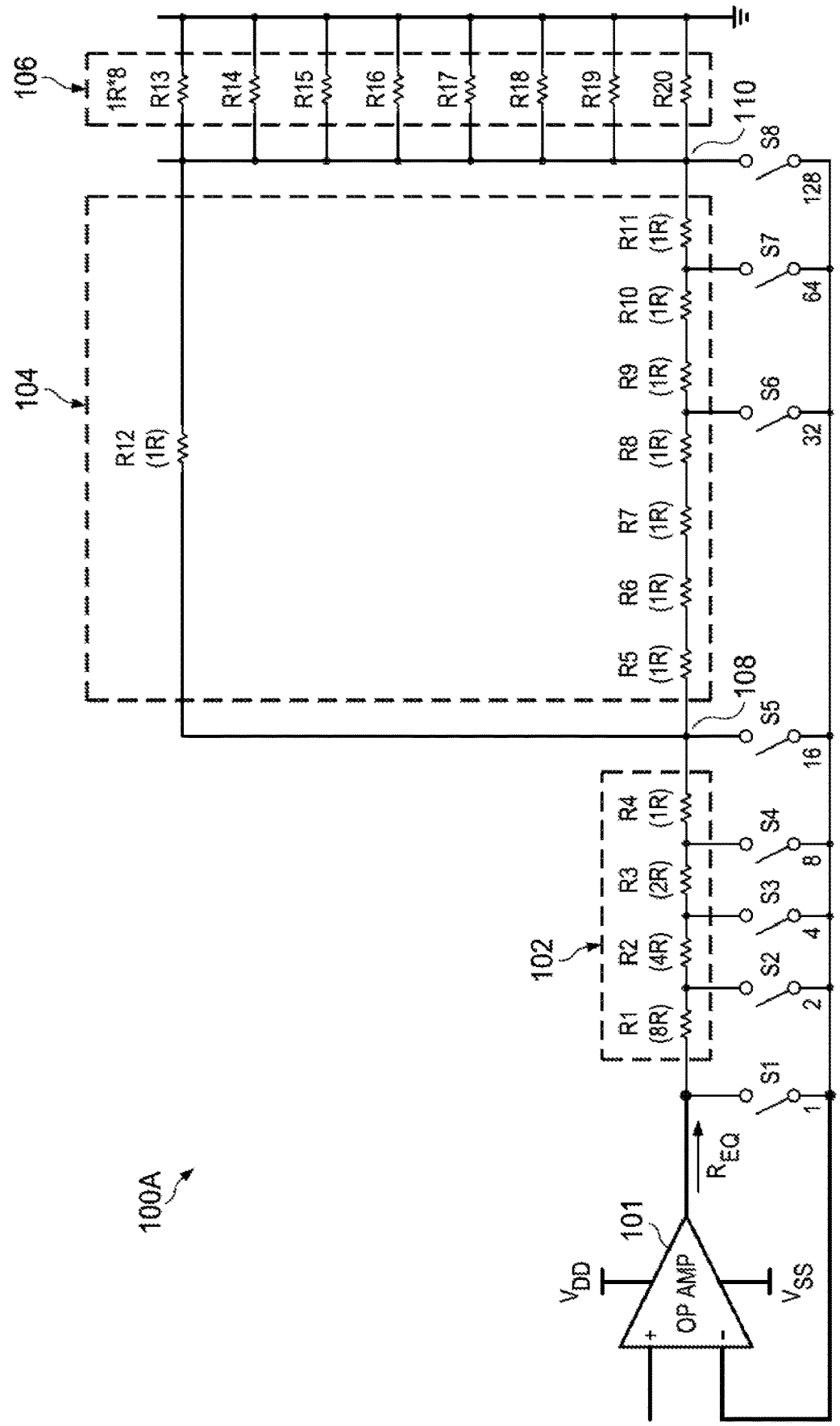
FIG. 1A depicts an implementation of a single-ended PGA according to an embodiment of the disclosure.
Figure 1B:
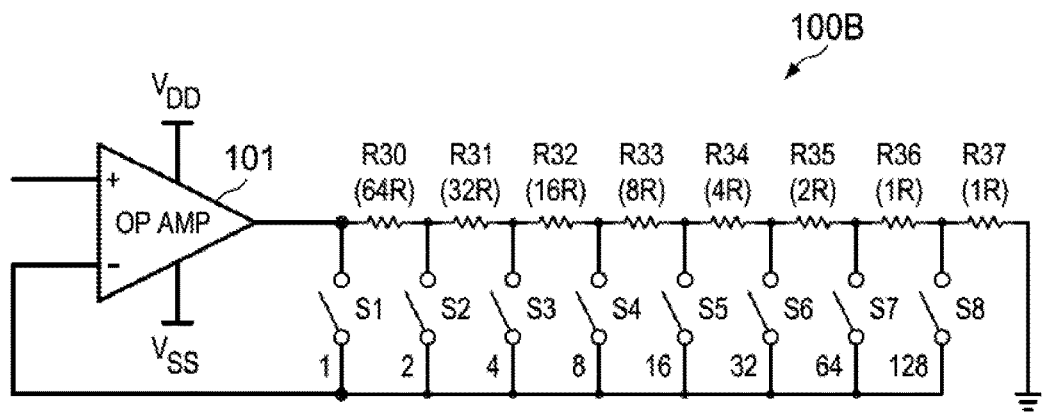
FIG. 1B depicts a prior art implementation of a single-ended PGA having the same programmable gain as in FIG. 1A.

FIG. 1B depicts a single-ended PGA 100B capable of providing gain having a selected value between 1 and 128 according to the prior art. In PGA 100B, a series of resistors R30-R37 are coupled in series between the output node of operational amplifier 101 and the lower rail, with switches S1-S8 coupled to tap the series of resistors R30-R37 before and after each resistor. Resistor R30 has a resistance of 64R, with R being a constant value selected for the application; resistor R31 has a resistance of 32R; resistor R32 has a resistance of 16R; resistor R33 has a resistance of 8R; resistor R34 has a resistance of 4R; resistor R35 has a resistance of 2R; and resistors R36, R37 each have a resistance of 1R.

PGA 100B requires the equivalent of 128 unit resistors, a sum of the individual resistances (R) of all of the resistors in the feedback loop. In accordance with Equation 1; each successive resistor in this embodiment doubles the gain of PGA 100B. When switch S1 is closed, the entire output voltage $V_{OUT}$ is provided to the feedback loop and PGA 100B has a gain of 1. When switch S2 is closed, the gain is 2; when switch S3 is closed, the gain is 4. Similarly, closing switch S4 gives a gain of 8; closing switch S5 gives a gain of 16; closing switch S6 provides a gain of 32; closing switch S7 provides a gain of 64; and closing switch S8 provides a gain of 128.

In comparing different PGAs, several numbers are of interest, such as the resistance of a unit resistor $R_{UNIT}$ (shown as simply R in the figures), the total resistance in the feedback loop, i.e., the sum of the values of all of the resistors in the feedback loop, which determines the size of the feedback loop when implemented in silicon, and the equivalent resistance $R_{EQ}$, which is the actual resistance experienced by the overall feedback loop at maximum gain. $R_{EQ}$ can be calculated using the following formula:

$$I_{DRIVE} = V_{OUT}/R_{EQ} \quad \text{Equation 3}$$

For example, when designed to operate with an output voltage $V_{OUT}$ of 0.5 V and a drive current of 100 µA, $R_{EQ}$ is equal to 0.5V/0.0001 A or 5 kohm. To work in the design of PGA 100B, $R_{UNIT}$ is 39.0625 ohms. Using a value of $R_{UNIT}$ that is less than 40 ohms does not allow any leeway for process variation during silicon processing. This specific design combination is therefore not suitable for industrial silicon design.

The $R_{UNIT}$ for this design can, of course, be designed to be larger and more suitable for industrial processes. For example, if $R_{UNIT}$ is set to 500 ohms, with $V_{OUT}$ remaining equal to 0.5 V, the equivalent resistance is 128*$R_{UNIT}$ or 64 kohms, $R_{TOTAL}$ is also 128*$R_{UNIT}$ or 64 kohms and $I_{DRIVE}$ is 7.8125 µA. The embodiment of PGA 100B requires a large area for the implementation of the resistors but provides only poor performance.

Figure 1C:
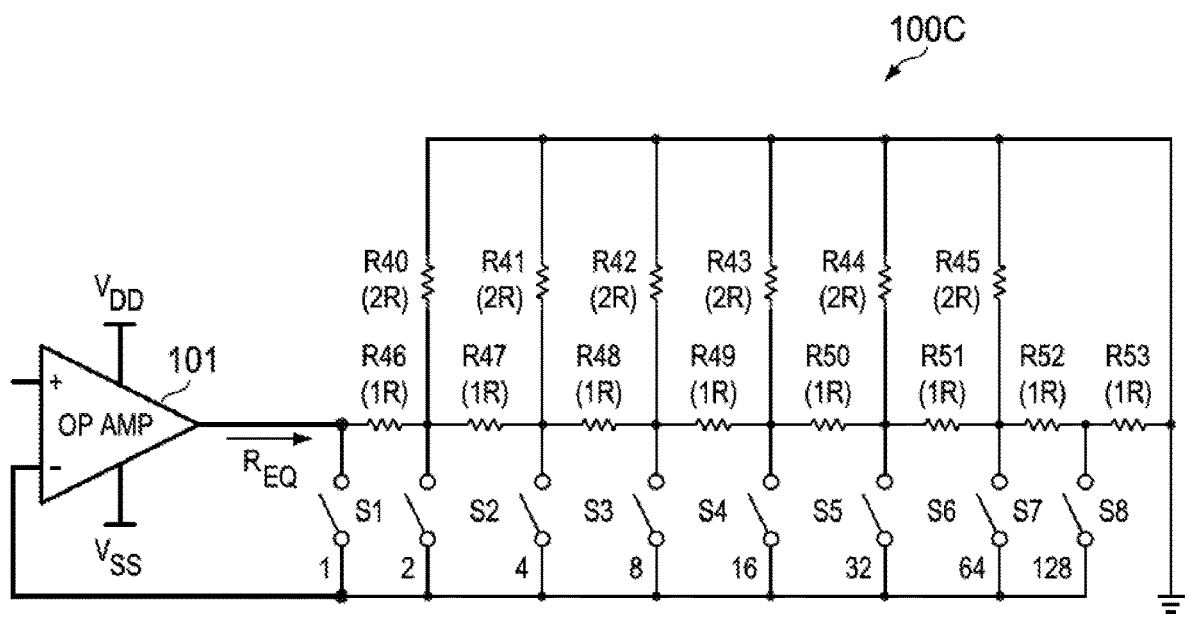
FIG. 1C depicts a second prior art implementation of a single-ended PGA having the same programmable gain as in FIG. 1A.

An alternate prior art embodiment that provides a programmable gain between 1 and 128 is shown in FIG. 1C. In PGA 100C, the resistor network includes a set of resistors R46-R53, which are coupled in series, each of resistors R46-R53 having a resistance of 1R. A second set of resistors R40-R45 are also provided, each having a resistance of 2R. Each of resistors R40-R45 has a first terminal coupled between a pair of resistors in the set of resistors R46-R53 and a second terminal coupled to the lower rail. That is, resistor R40 has a first terminal coupled between resistors R46 and R47 and a second terminal coupled to the lower rail; resistor R41 has a first terminal coupled between resistors R47 and R48; resistor R42 has a first terminal coupled between resistors R48 and R49; resistor R43 has a first terminal coupled between resistors R49 and R50; resistor R44 has a first terminal coupled between resistors R50 and R51; and resistor R45 has a first terminal coupled between resistors R51 and R52.

Switches S1-S8 are coupled to tap the series of resistors R46-R53 before each successive resistor. As in the previous example, closing a successive switch from left to right doubles the gain, so that closing switch S1 provides a gain of 1, closing switch S2 provides a gain of 2, switch S3 provides a gain of 4; closing switch S4 provides a gain of 8; closing switch S5 provides a gain of 16; closing switch S6 provides a gain of 32; closing switch S7 provides a gain of 64; and closing switch S8 provides a gain of 128.

PGA 100C requires the equivalent of 20 unit resistors. If the same drive current of 100 µA as in the previous example is utilized with $V_{OUT}$ equal to 0.5 V, $R_{UNIT}$ is equal to 2.5 kohms, $R_{EQ}$ is equal to $2*R_{UNIT}$ or 5 kohms and $R_{TOTAL}$ is equal to $20*R_{UNIT}$ or 50 kohms. Thus, this embodiment requires a large area for implementation under this first set of conditions. If a unit resistance of 500 ohms is utilized instead, $R_{EQ}$ is 1 kohm, $I_{DRIVE}$ is 500 µA and $R_{TOTAL}$ is 10 kohms. This embodiment has high power requirements under this second set of conditions.

FIG. 1A depicts a single-ended PGA 100A capable of providing a gain of between 1 and 128 according to an embodiment of the disclosure. Three sets of resistors make up the resistor network for PGA 100A, which in this embodiment includes a first set of resistors 102 coupled in series between the output node of operational amplifier 101 and a first node 108, a second set of resistors 104 in which a number of series-coupled resistors R5-R11 are coupled in parallel with resistor R12 between first node 108 and a second node 110, and a third set of resistors 106 which are coupled in parallel between the second node 110 and the lower rail.

The first set of resistors 102 includes resistor R1 having a resistance of 8R, resistor R2 having a resistance of 4R, resistor R3 having a resistance of 2R and resistor R4 having a resistance of 1R. Switches S1-S5 are coupled to tap the series of resistors R1-R4 before and after each resistor in the first set of resistors. Switch S1 provides a gain of 1, switch S2 provides a gain of 2, switch S3 provides a gain of 4, switch S4 provides a gain of 8 and switch S5 provides a gain of 16.

The second set of resistors 104 includes resistor R12 coupled in parallel with series-coupled resistors R5-R11 between node 108 and node 110, with each of resistors R5, R6, R7, R8, R9, R10, R11, R12 being unit resistors. Switches S6, S7 and S8 are coupled respectively to a point between resistors R8/R9, to a point between resistors R10/R11 and to node 110. Switch S6 provides a gain of 32, switch S7 provides a gain of 64 and switch S8 provides a gain of 128. The third set of resistors 106 includes eight resistors R13-R20 coupled in parallel between node 110 and the lower rail, each of resistors R13, R14, R15, R16, R17, R18, R19, R20 having a resistance of 1R. The equivalent resistance of the combined second and third sets of resistors is only 1R, yet this portion of the resistor network provides three additional taps to extend the gain offered without significantly increasing the equivalent resistance of the entire network.

The thermal noise of a resistor or resistor network is determined by the following equation:

$$S_v(f) = 4kTR_{EQ} \qquad \text{Equation 4}$$

where $S_v(f)$ is the voltage spectral density,
$k=1.38\times10^{-23}$ J/K is the Boltzman constant, and
T is the absolute temperature of the resistor in Kelvin.
It can be understood from this equation that reducing the equivalent resistance of the resistor network also reduces the thermal noise provided by that resistor network. Accordingly, the layout the resistor network of PGA 100A can reduce the thermal noise as compared to at least some prior art embodiments.

PGA 100A requires 31 unit resistors. When the PGA is designed for a drive current of 100 µA and a $V_{OUT}$ of 0.5 V, $R_{UNIT}$ is equal to 312.5 ohms, $R_{EQ}$ is equal $16*R_{UNIT}$ or 5 kohms, and $R_{TOTAL}$ is equal to $31*R_{UNIT}$ or 9.6875 kohms. If $R_{UNIT}$ is set to 500, as in the second set of previous examples, $R_{EQ}$ is equal to 8 kohms, $I_{DRIVE}$ is equal to $V_{OUT}/R_{EQ}$ or 62.5 µA and $R_{TOTAL}$ $31*R_{UNIT}$ or 15.5 kohms.

A side-by side comparison of the embodiments of PGA 100A, 100B, 1000 is shown below, first with a constant drive current in Table 1 and then with a constant unit of resistance in Table 2:

TABLE 1

| PGA | $I_{DRIVE}$ (µA) | $V_{OUT}$ (V) | # Unit resistors | $R_{UNIT}$ (Ω) | $R_{EQ}$ (kΩ) | $R_{TOTAL}$ (kΩ) |
| --- | --- | --- | --- | --- | --- | --- |
| 100A | 100 | 0.5 | 31 | 312.5 | 5 | 9.6875 |
| 100B | 100 | 0.5 | 128 | 39.0625 | 5 | 5 |
| 100C | 100 | 0.5 | 20 | 2500 | 5 | 50 |

In embodiments having the same drive current, PGA 100A requires a much small number of unit resistors compared to PGA 100B. As mentioned previously, at the voltage and drive current shown in this figure, PGA 100B is not even viable for reproduction in silicon. Additionally, PGA 100A utilizes much less area to implement the resistor array compared to PGA 1000.

TABLE 2

| PGA | $I_{DRIVE}$ (µA) | $V_{OUT}$ (V) | # Unit resistors | $R_{UNIT}$ (Ω) | $R_{EQ}$ (kΩ) | $R_{TOTAL}$ (kΩ) |
| --- | --- | --- | --- | --- | --- | --- |
| 100A | 62.5 | 0.5 | 31 | 500 | 8 | 15.5 |
| 100B | 7.8125 | 0.5 | 128 | 500 | 64 | 64 |
| 100C | 500 | 0.5 | 20 | 500 | 1 | 10 |

Comparing the three embodiments using equal units of resistance, PGA 100A occupies much less area than PGA 100B and thus provides cost savings. PGA 100A also provides better matching with fewer matching units and less thermal noise compared with PGA 100B. Using equal units of resistance, PGA 100A requires much less power than PGA 1000 due to the lower drive current.

Figure 2A:
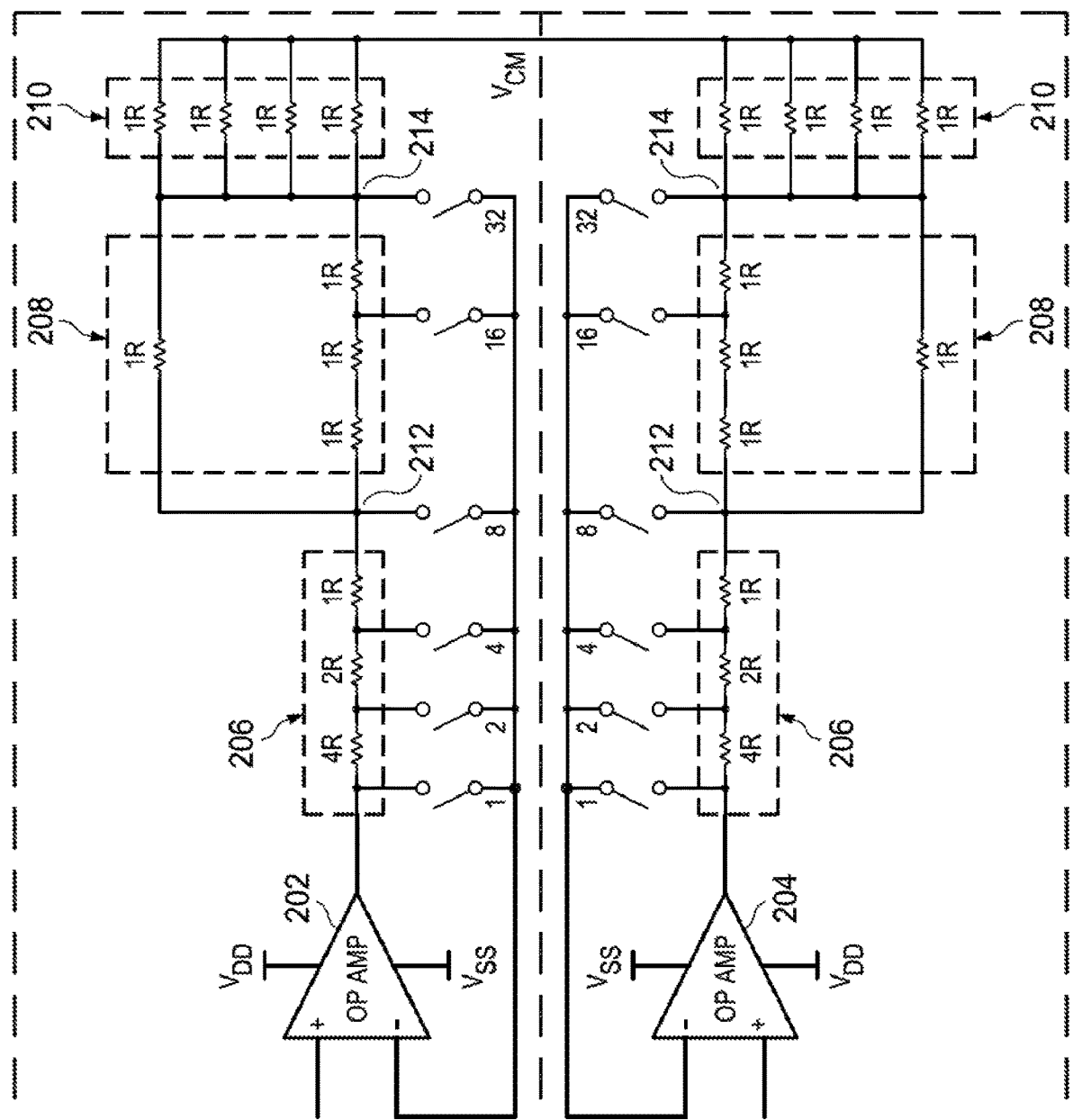
FIG. 2A depicts an implementation of a PGA according to an embodiment of the disclosure.
Figure 2B:
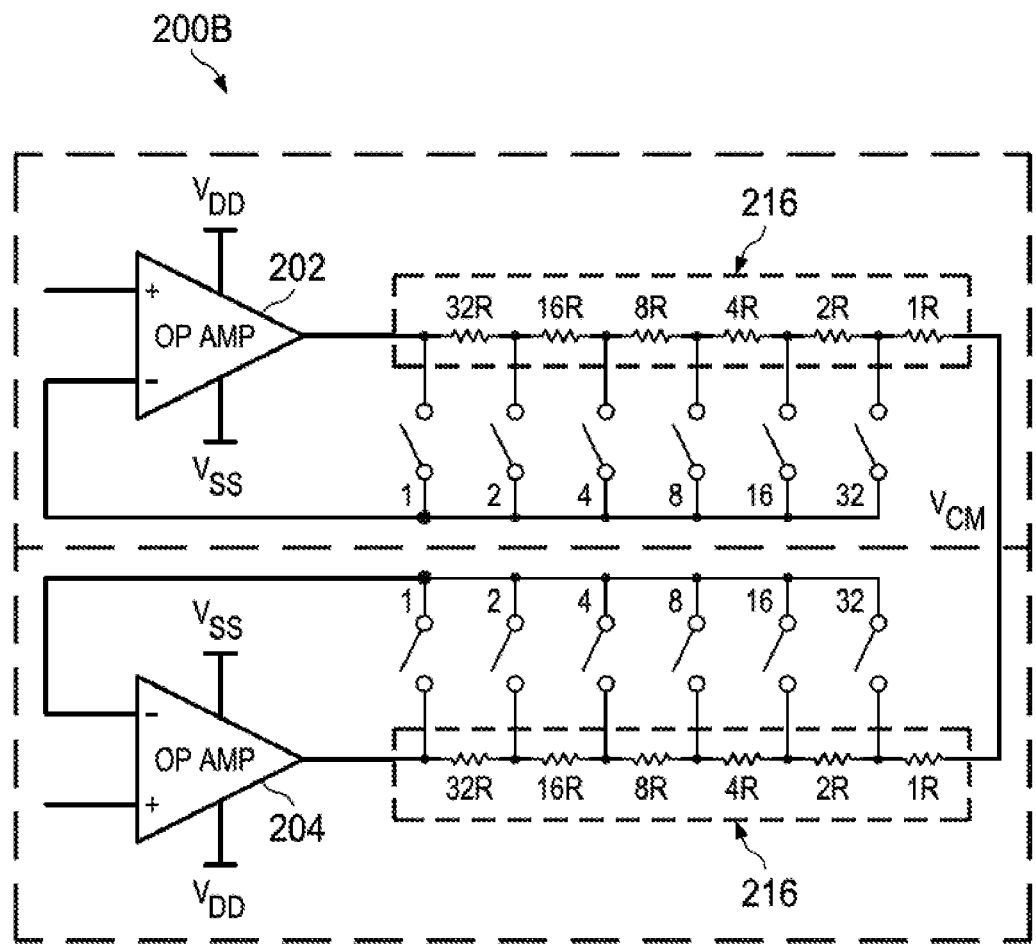
FIG. 2B depicts a prior art implementation of a PGA having the same programmable gain as in FIG. 2A.
Figure 3A:
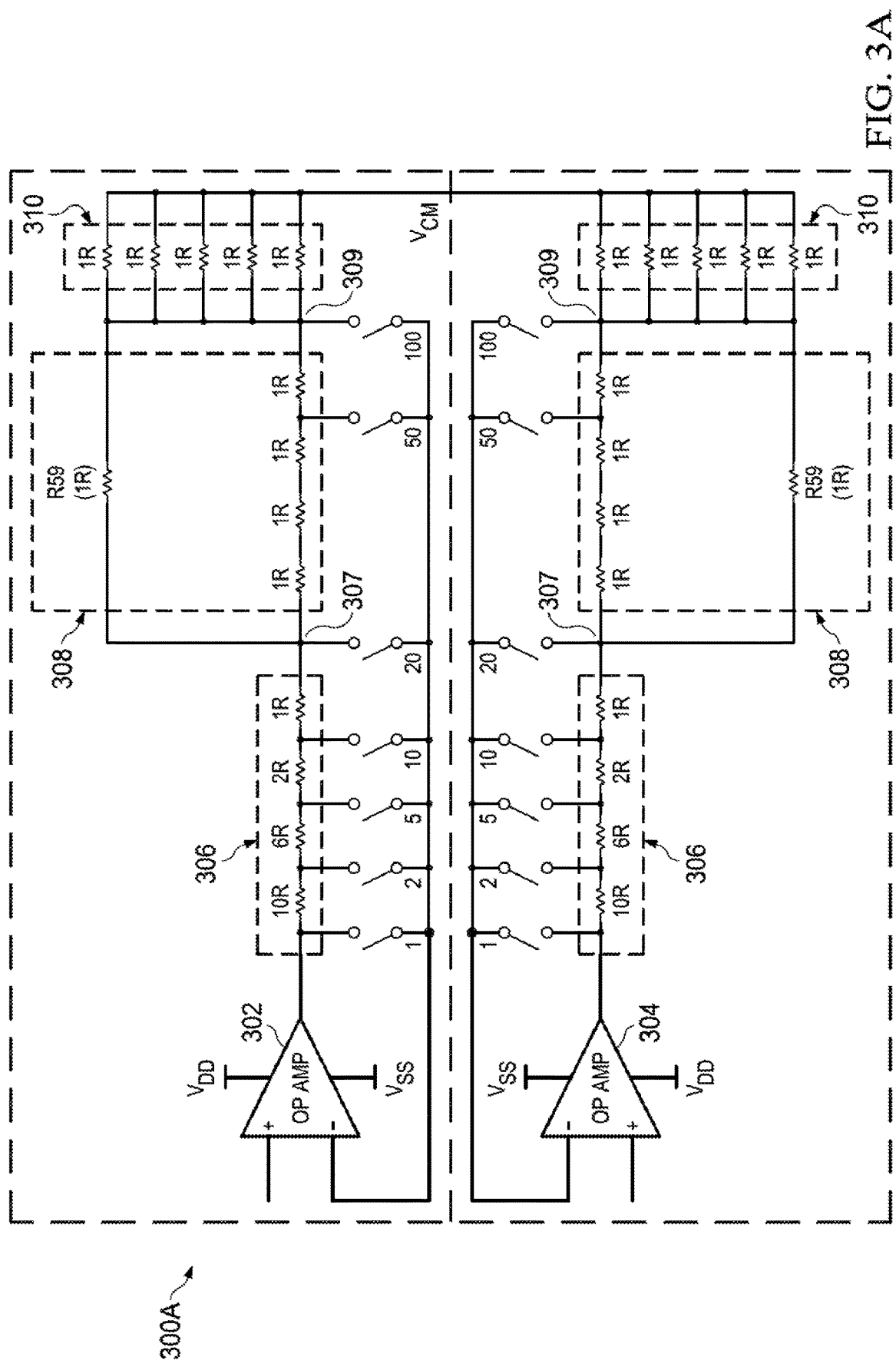
FIG. 3A depicts an implementation of a PGA according to an embodiment of the disclosure.
Figure 3B:
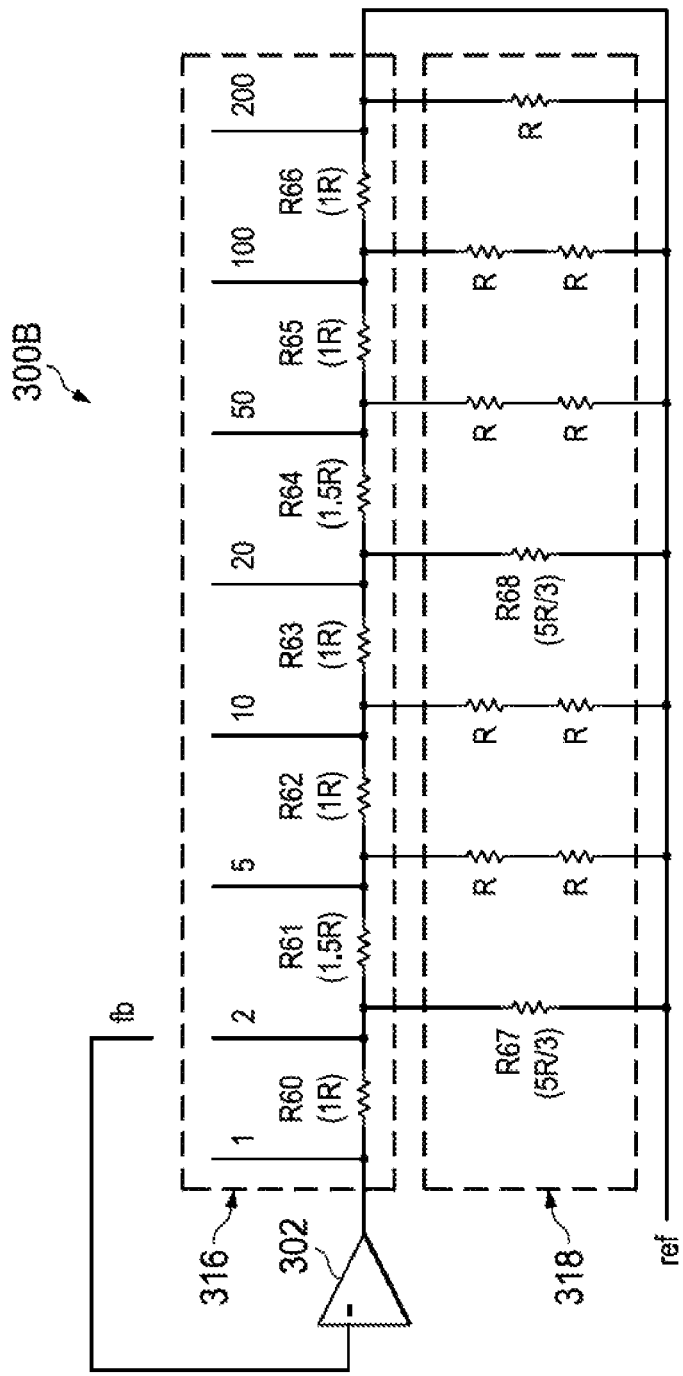
FIG. 3B depicts a prior art implementation of a PGA having the same programmable gain as in FIG. 3A.

The examples in FIGS. 1A-1C disclose single-ended PGAs, but it will be understood that the disclosed concepts are also applicable to PGAs providing differential outputs. FIGS. 2A and 3A provide further examples of PGAs 200A, 300A according to embodiments of the disclosure, while FIGS. 2B and 3B provide examples of the prior art PGAs 200B, 300B that can be replaced by PGAs 200A, 300A. Both of PGAs 200A, 200B offer programmable gain from 1 to 32. Other than providing differential outputs, PGAs 200A and 200B are shorter versions of the previously presented PGAs 100A and 100B respectively. Each of operational amplifiers 202, 204 in PGA 200B has a resistor array 216 that includes six resistors coupled in series and having respective resistances of 32R, 16R, 8R, 4R, 2R, and 1R for a total resistance of 64R, giving PGA 200B a total resistance of 128.

In contrast, each operational amplifier 202, 204 of PGA 200A includes a resistor array with three resistor sets 206, 208, 210. Resistor set 206 includes three resistors coupled in series between the output node of the operational amplifier and a first node 212 and having respective resistances of 4R, 2R and 1R. Second resistor set 208 includes three resistors coupled in series between node 212 and node 214 and a further resistor coupled in parallel to the three resistors between node 212 and node 214. Finally, the third set 210 includes four resistors coupled in parallel between node 214 and a common mode voltage $V_{CM}$; each of the resistors in the second and third sets has a resistance of 1R. The resistor arrays in the respective feedback loops of operational amplifiers 202, 204 in PGA 200A each requires a resistance of 15R for a total resistance in PGA 200A of 30R. As in the prior comparison, when the two implementations are designed with equal drive currents, PGA 200A requires much less area than PGA 200B. When compared to PGA 200B with equal drive currents, the embodiment of PGA 200A requires a much smaller number of units of resistance and achieves better matching. When the implementations are designed with equal values of $R_{UNIT}$, PGA 200A occupies much less area than PGA 200B.

FIGS. 3A and 3B depict embodiments of PGAs 300A, 300B in which a gain of 1, 2, 5, 10, 20, 50 or 100 can be selected, with PGA 300A receiving a differential signal while PGA 300B is single-ended. PGA 300B is similar to PGA 1000 in that the feedback loop for operational amplifier 302 includes a set of resistors 316 coupled in series and a set of resistors 318 coupled in parallel between ones of the series-coupled resistors and a reference voltage. In resistor set 316, resistors R60, R62, R63, R65, R66 each have resistance R, while resistors R61, R64 each have resistance of 1.5R. In resistor set 318, all resistors have resistance of 1R except for resistors R67, R68, which each have resistance of 5R/3. PGA 300B has a total resistance of about 20R.

PGA 300A has the same general layout as in FIG. 1A, but different resistor values. Each of operational amplifiers 302, 304 has a feedback loop that incorporates three sets of resistors 306, 308, 310. Resistor set 306 includes four resistors having respective values of 10R, 6R, 2R and 1R, which are coupled in series between the output node of the respective operational amplifier and a node 307. Resistor set 308 includes four resistors coupled in series between node 307 and node 309, each having resistance of 1R, and resistor R59, which has a resistance of 1R and is coupled in parallel with the remaining resistors in resistor set 308 between node 307 and node 309. Third resistor set 310 includes five resistors coupled in parallel between node 309 and reference voltage $V_{CM}$. Depending on the design parameters utilized, PGA 300A can be implemented in less area or can require lower power to operate than PGA 300B.

Figure 4A:
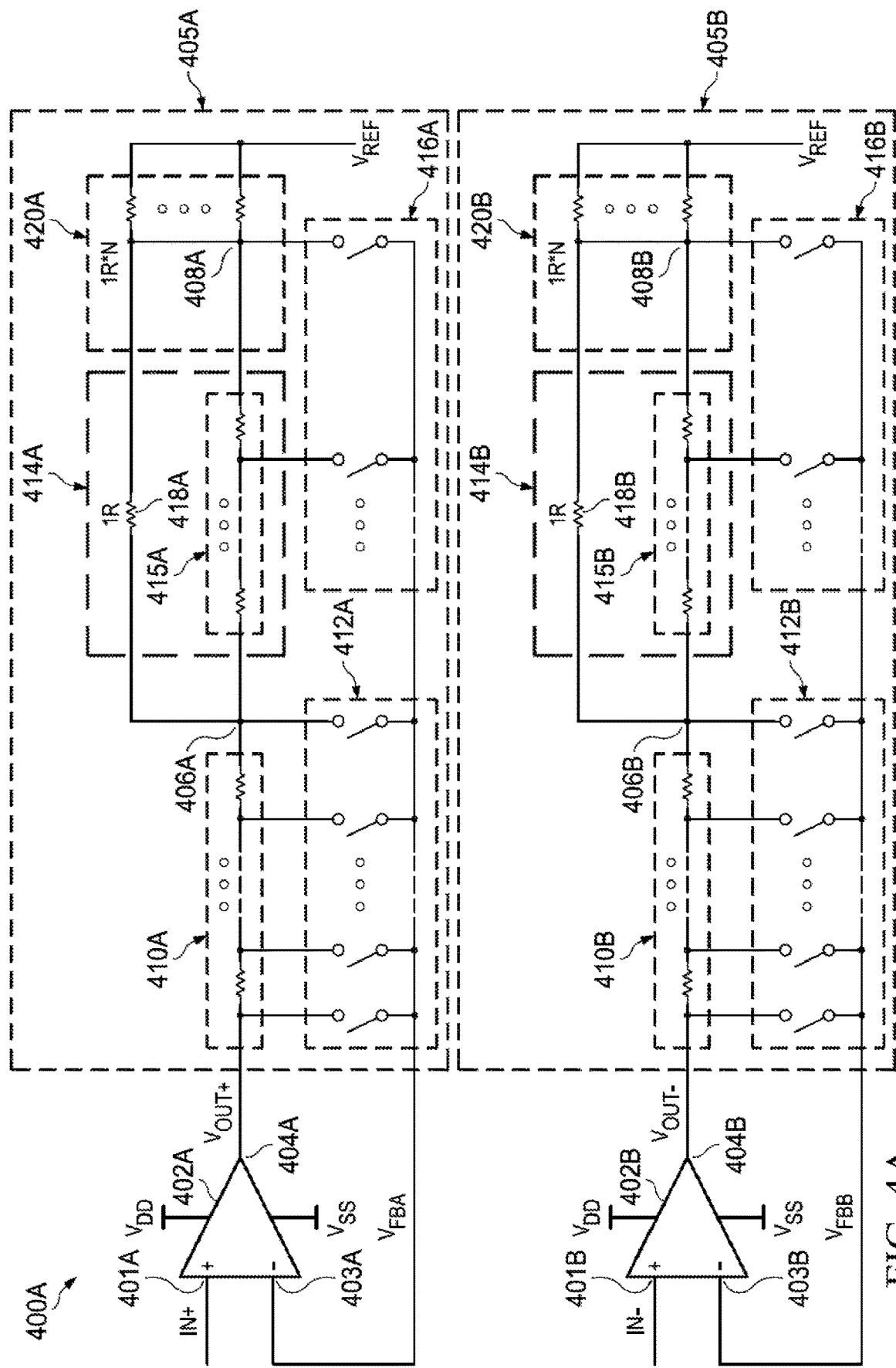
FIG. 4A depicts a generalized implementation of a PGA according to an embodiment of the disclosure.

FIG. 4A depicts a generalized PGA 400A according to an embodiment of the disclosure. PGA 400A includes operational amplifiers 402A, 402B, each having a respective resistor network 405A, 405B as part of a feedback loop. Each of operational amplifiers 402A, 402B includes a non-inverting input node 401, an inverting input node 403 and an output node 404. Each resistor network 405 includes three resistor sets 410, 414, 420. Resistor set 410 includes M resistors coupled in series between output node 404 of operational amplifier 402 and resistor network node 406, where M is an integer greater than or equal to two. Each of the resistors in resistor set 410 can have a resistance value that is an integer multiple of $R_{UNIT}$, although that is not a requirement. A set of M+1 switches 412 are located to provide taps before and after each of the resistors in resistor set 410 so that a feedback voltage $V_{FB}$ can be provided to the inverting input 403 of operational amplifier 402.

Resistor set 414 includes N−1 resistors 415 coupled in series between resistor network node 406 and resistor network node 408, where N is an integer, and also includes resistor 418, which is coupled between resistor network node 406 and resistor network node 408 in parallel with resistors 415. Each of the resistors in resistor set 414 is a unit resistor. Switches 416 are generally not located after each of the series-coupled resistors in resistor set 415, but rather are placed after selected resistors in resistor set 415 to provide appropriate values for feedback voltage $V_{FB}$ and determine desired gain. Finally, resistor set 420 includes N resistors coupled in parallel between resistor network node 408 and reference voltage $V_{REF}$, with all of the resistors in resistor network 420 being unit resistors. It will be understood that although the embodiment of FIG. 4A has been shown as a PGA that utilizes a differential signal, PGA 400A can also be implemented as a single-ended PGA. In both implementations, the layout of resistor network 405 can provide improvements in one or more of CMRR performance, gain error, smaller area for implementation and lower power requirements when compared with prior art embodiments.

Figure 4B:
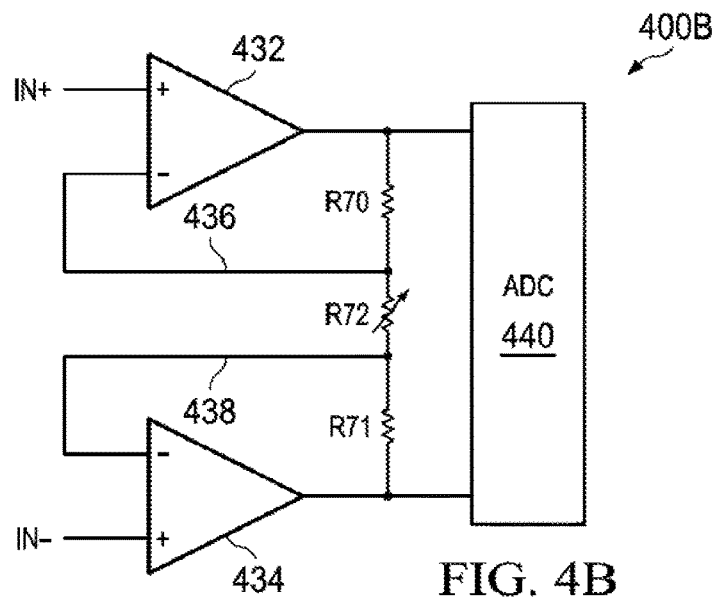
FIG. 4B depicts a schematic of a PGA that can incorporate a resistor feedback network according to the disclosed embodiments.

FIG. 4B depicts an alternate layout for a PGA 400B according to an embodiment of the disclosure. PGA 400B contains two operational amplifiers 432, 434, which are coupled to receive differential input signals IN+, IN− on respective non-inverting inputs. In this embodiment, each of operational amplifiers 432, 434 provides an output signal to ADC 440. The output node and the inverting input node of operational amplifier 432 are coupled to provide a feedback loop 436, which includes resistor R70. Similarly, the output node and the inverting input node of operational amplifier 434 are coupled to provide a feedback loop 438, which includes resistor R71. Resistor R72 is a variable resistor that is coupled between the output node of operational amplifier 432 and the output node of operational amplifier 434. By implementing resistor R72 as resistor network 405, the number of resistors and/or the size of the resistor network can be decreased while achieving the same gain as in earlier versions of resistor R72. The CMRR can be improved due to better matching of resistors.

Figure 5:
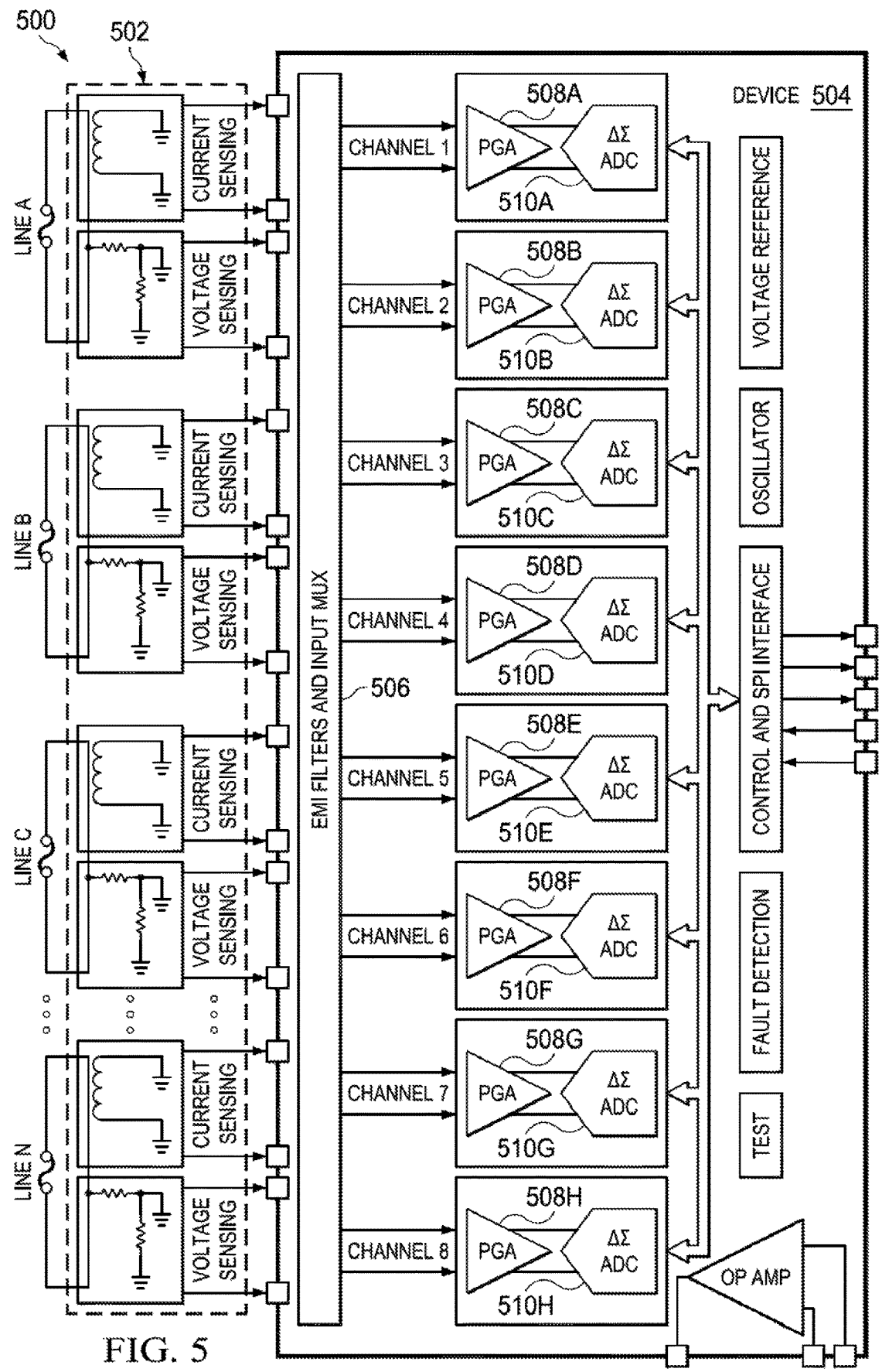
FIG. 5 depicts a schematic of an ADC in which the disclosed PGA can be utilized.

FIG. 5 depicts a schematic of an electronic device 500 that can include a number of programmable operational amplifiers according to an embodiment of the disclosure. Electronic device 500 is an analog front end that provides a multichannel, simultaneous sampling, ΔΣ ADC with built-in PGAs. Sensors 502 provide voltage and current sensing input to chip 504, which receives the multiple inputs at electromagnetic interference (EMI) filters and input multiplexor 506. The inputs are passed via appropriate channels to one of PGAs 508A-508H. The output from each PGA 508 is then sent to a respective ΔΣ ADC 510A-510H. The output from the ADC 510 is sent to a control and serial peripheral interface (SPI), where the information can be provided on chip outputs. PGAs 508 can be implemented in accordance with the embodiment of one of PGA 400A, 400B to provide the disclosed advantages in CMRR and gain error.

Figure 6:
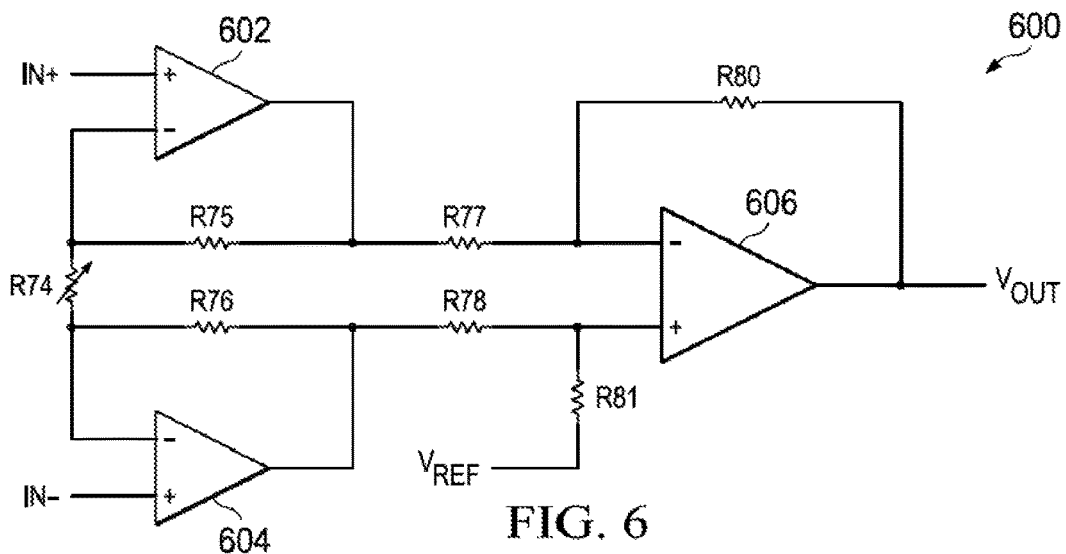
FIG. 6 depicts a schematic of a instrumentation amplifier in which the disclosed resistor network can be utilized.

FIG. 6 depicts an instrumentation amplifier 600 that can be designed with a programmable gain according to an embodiment of the disclosure. Differential signals IN+, IN− are received on the non-inverting input respectively of operational amplifier 602 and operational amplifier 604. The output of operational amplifier 602 is provided to the inverting input of operational amplifier 606 through resistor R77 and is also provided in a feedback loop through resistor R75 to the inverting input of operational amplifier 602. Similarly, the output of operational amplifier 604 is provided to the non-inverting input of operational amplifier 606 through resistor R78 and is also provided in a feedback loop through resistor R76 to the inverting input of operational amplifier 604.

Output $V_{OUT}$ of operational amplifier 606 is provided through resistor R80 to a point between resistor R77 and the inverting input of operational amplifier 606, while a point between resistor R78 and the non-inverting input of operational amplifier 606 is coupled through resistor R81 to a reference voltage $V_{REF}$. Variable resistor R74 is coupled between the output node of operational amplifier 602 and the output node of operational amplifier 604 and determines the gain of instrumentation amplifier 600. Instrumentation amplifier 600 can be implemented with programmable gain by implementing resistor R74 as resistor network 405.

Applicant has disclosed a programmable gain operational amplifier and a programmable gain instrumentation amplifier that can provide improvements in one or more of CMRR, resistor matching, gain error, area required and power required as compared to prior art PGAs providing the same selectable gain. The disclosed PGA is suitable for use with a Y ADC.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A circuit comprising:
   an operational amplifier (Op-Amp) that includes:
      an input; and
      an output;
   a first set of resistors electrically connected in series with each other that includes:
      an input coupled to the output of the Op-Amp; and
      an output;
   a second set of resistors electrically connected in series with each other that includes:
      an input coupled to the output of the first set of resistors; and
      an output;
   a third set of resistors electrically connected in parallel with each other that includes:
      an input coupled to the output of the second set of resistors; and
      an output; and
   and a first resistor coupled between the output of the first set of resistors and the output of the second set of resistors, wherein the first resistor is coupled in parallel with the second set of resistors.

2. The circuit of claim 1, wherein:
   the output of the third set of resistors is coupled to a ground reference.

3. The circuit of claim 1, wherein:
   the output of the third set of resistors is coupled to a reference voltage.

4. The circuit of claim 1, wherein:
   the output of the third set of resistors is coupled to a common mode voltage.

5. The circuit of claim 1, wherein the first set of resistors includes:
   a second resistor having a value equal to the first resistor.

6. The circuit of claim 5, wherein the first set of resistors includes:
   a third resistor having a value equal to twice a value of the first resistor;
   a fourth resistor having a value equal to three times the value of the third resistor; and
   a fifth resistor having a value equal to five times the value of the third resistor.

7. The circuit of claim 5, wherein the first set of resistors includes:
   a third resistor having a value equal to twice a value of the first resistor;
   a fourth resistor having a value equal to twice the value of the third resistor; and
   a fifth resistor having a value equal to twice the value of the fourth resistor.

8. The circuit of claim 1, wherein each resistor of the second set of resistors and the third set of resistors are equal to the first resistor.

9. The circuit of claim 1, comprising:
   a feedback path coupled to the input of the Op-Amp;
   a set of switches, the set of switches including:
      a first switch arranged between the output of the Op-Amp and the feedback path and configured to couple the output of the Op-Amp to the feedback path when the first switch is closed;
      a second switch arranged between the output of the first set of resistors and the feedback path and configured to couple the first set of resistors to the feedback path when the second switch is closed; and
      a third switch arranged between the output of the second set of resistors and the feedback path and configured to couple the second set of resistors to the feedback path when the third switch is closed.

10. The circuit of claim 9, comprising:
    at least one additional switch, each of the at least one additional switches being arranged between the feedback path and between two adjacent resistors from the first set of resistors.

11. The circuit of claim 9, comprising:
    at least one additional switch, each of the at least one additional switches being arranged between the feedback path and between two adjacent resistors from the second set of resistors.

12. The circuit of claim 9, wherein:
    the input of the Op-Amp has an inverting input; and
    the feedback path is coupled to the inverting input.

13. An electronic device comprising:
    a programmable gain amplifier including:
       an operational amplifier; and
       a resistor network coupled to an output of the operational amplifier, wherein the resistor network includes:
          a first set of resistors coupled between the output of the operational amplifier and a second set of resistors,
             wherein resistors of the first set are electrically connected in series with each other, and
             wherein resistors of the second set are electrically connected in series with each other and include a first number of resistors;
          a third set of resistors coupled between the second set of resistors and a first voltage,
             wherein resistors of the third set are electrically connected in parallel with each other and include a second number of resistors; and
          a resistor coupled in parallel between the first set of resistors and the third set of resistors and arranged in parallel with the second set of resistors.

14. The electronic device of claim 13, wherein the operational amplifier is a first operational amplifier, the resistor network is a first resistor network, and the resistor coupled between the first set of resistors and the third set of resistors of the first resistor network is a first resistor, and wherein the programmable gain amplifier further includes:
- a second operational amplifier; and
  - a second resistor network coupled to an output of the second operational amplifier, wherein the second resistor network includes:
    - a fourth set of resistors coupled between the output of the second operational amplifier and a fifth set of resistors,
      - wherein the resistors of the fourth set are electrically connected in series with each other, and
      - wherein resistors of the fifth set are electrically connected in series with each other and include a third number of resistors;
    - a sixth set of resistors coupled between the fifth set of resistors and a second voltage,
      - wherein resistors of the sixth set are electrically connected in parallel with each other and include a fourth number of resistors; and
    - a second resistor coupled in parallel between the fourth set of resistors and the sixth set of resistors and arranged in parallel with the fifth set of resistors.

15. The electronic device of claim 14, wherein the second number is greater than the first number and equal to the fourth number and the first number is equal to the third number.

16. The electronic device of claim 15, wherein the second number and the fourth number are greater than the first number and the third number, respectively, by one.

17. The electronic device of claim 14, wherein the first and second resistors each have a same first resistance value, and wherein each resistor of the second, third, fifth, and sixth sets of resistors has a resistance value equal to the first resistance value.

18. The electronic device of claim 14, comprising:
- a first feedback path coupled to a first input of the first operational amplifier;
- a second feedback path coupled to a first input of the second operational amplifier;
- a first set of switches including a first switch arranged between the first set of resistors, the second set of resistors, and the first feedback path,
  - wherein the first set of switches is configured to couple the first set or resistors to the first feedback path when the first switch is closed;
- a second switch arranged between the second set of resistors, the third set of resistors, and the first feedback path,
  - wherein the second switch is configured to couple the second set of resistors to the first feedback path when the second switch is closed; and
- at least one additional switch of the first set of switches,
  - wherein each of the at least one additional switches of the first set of switches is arranged between the first feedback path and two adjacent resistors from either the first set of resistors or the second set of resistors and configured to couple the respective set of resistors to the first feedback path when the additional switch is closed.

19. The electronic device of claim 18, comprising:
- a second set of switches including a third switch arranged between the fourth set of resistors, the fifth set of resistors, and the second feedback path,
  - wherein the second set of switches is configured to couple the fourth set of resistors to the second feedback path when the third switch is closed;
- a fourth switch arranged between fifth set of resistors, the sixth set of resistors, and the second feedback path,
  - wherein the fourth switch is configured to couple the fifth set of resistors to the second feedback path when the fourth switch is closed; and
- at least one additional switch of the second set of switches,
- wherein each of the at least one additional switches of the second set of switches is arranged between the second feedback path and two adjacent resistors from either the fourth set of resistors or the fifth set of resistors and configured to couple the respective set of resistors to the second feedback path when the additional switch is closed.

* * * * *